US011728000B1

(12) United States Patent
Ray et al.

(10) Patent No.: US 11,728,000 B1
(45) Date of Patent: Aug. 15, 2023

(54) SYSTEMS AND METHODS FOR DETECTING COUNTERFEIT OR DEFECTIVE MEMORY

(71) Applicants: Biswajit Ray, Madison, AL (US); Umeshwarnath Surendranathan, Huntsville, AL (US); Preeti Kumari, Huntsville, AL (US); Md Raquibuzzaman, Huntsville, AL (US)

(72) Inventors: Biswajit Ray, Madison, AL (US); Umeshwarnath Surendranathan, Huntsville, AL (US); Preeti Kumari, Huntsville, AL (US); Md Raquibuzzaman, Huntsville, AL (US)

(73) Assignee: Board of Trustees of the University of Alabama, for and on behalf of the University of Alabama in Huntsville, Huntsville, AL (US)

( * ) Notice: Subject to any disclaimer, the term of this patent is extended or adjusted under 35 U.S.C. 154(b) by 0 days.

(21) Appl. No.: 17/319,611

(22) Filed: May 13, 2021

Related U.S. Application Data

(63) Continuation-in-part of application No. 16/219,586, filed on Dec. 13, 2018, now Pat. No. 11,114,179.
(Continued)

(51) Int. Cl.
*G11C 29/02* (2006.01)
*G11C 29/50* (2006.01)
(Continued)

(52) U.S. Cl.
CPC ............ *G11C 29/021* (2013.01); *G11C 29/38* (2013.01); *G11C 29/44* (2013.01); *G11C 29/50* (2013.01)

(58) Field of Classification Search
CPC ....... G11C 29/021; G11C 29/38; G11C 29/44; G11C 29/50
(Continued)

(56) References Cited

U.S. PATENT DOCUMENTS 5,321,241 A 6/1994 Craine
5,652,803 A 7/1997 Tachikawa
(Continued)

OTHER PUBLICATIONS

Vincent van der Leest et al. (Anti-Counterfeiting with Hardware Intrinsic Security, 2013, IEEE, pp. 1-6) (Year: 2013).*
(Continued)

*Primary Examiner* — John J Tabone, Jr.
(74) *Attorney, Agent, or Firm* — Maynard Nexsen PC; Brian T. Sattizahn

(57) ABSTRACT

A system for testing memory includes logic that is configured to perform various normal memory operations (e.g., erase, read and write operations) on a memory device and to determine operational parameters associated with the memory operations. As an example, the amount of time to perform one or more memory operations may be measured, a number of errors resulting from the memory operations may be determined, or a number of memory cells storing noisy bits may be identified. One or more of the operational parameters may then be analyzed to determine whether they are in a range expected for counterfeit or defective memory. If so, the logic determines that the memory under test is counterfeit or defective and provides a notification about such determination.

18 Claims, 7 Drawing Sheets

Related U.S. Application Data

(60) Provisional application No. 63/024,268, filed on May 12, 2020, provisional application No. 62/598,243, filed on Dec. 13, 2017.

(51) Int. Cl.
*G11C 29/38* (2006.01)
*G11C 29/44* (2006.01)

(58) Field of Classification Search
USPC ........... 714/718, 719, 720, 721, 723, 42, 54; 365/200, 201
See application file for complete search history.

(56) References Cited

U.S. PATENT DOCUMENTS

| | | |
|---|---|---|
| 6,442,644 B1 | 8/2002 | Gustavson |
| 6,659,353 B1 | 12/2003 | Okamoto |
| 7,415,732 B2 | 8/2008 | Montecalvo |
| 7,491,948 B2 | 2/2009 | Gordon et al. |
| 8,179,720 B2 * | 5/2012 | Fukuda ............... G11C 16/3436 365/185.23 |
| 8,572,440 B1 | 10/2013 | Nunally |
| 9,530,512 B2 | 12/2016 | Ray et al. |
| 9,543,028 B2 | 1/2017 | Ray et al. |
| 9,575,125 B1 | 2/2017 | Andre |
| 10,078,462 B2 * | 9/2018 | Wang ......................... G06F 7/58 |
| 10,204,008 B2 | 2/2019 | Trezise |
| 10,223,199 B2 | 3/2019 | Hahn |
| 10,509,132 B1 | 12/2019 | Ray et al. |
| 10,878,922 B1 | 12/2020 | Ray et al. |
| 11,114,179 B1 * | 9/2021 | Ray ......................... G06F 3/0619 |
| 2004/0041197 A1 | 3/2004 | Jong et al. |
| 2004/0191989 A1 | 9/2004 | Ngo |
| 2007/0043667 A1 | 2/2007 | Qawami |
| 2007/0079387 A1 | 4/2007 | Montecalvo |
| 2008/0082872 A1 | 4/2008 | Nagasaka |
| 2009/0165086 A1 | 6/2009 | Trichina |
| 2010/0125765 A1 | 5/2010 | Orbach |
| 2010/0140488 A1 | 6/2010 | Visconti |
| 2011/0234241 A1 | 9/2011 | Lewis et al. |
| 2012/0166814 A1 | 6/2012 | Hayashi |
| 2013/0019132 A1 * | 1/2013 | Amirkhanyan ......... G11C 29/08 714/721 |
| 2013/0127442 A1 | 5/2013 | Satoh |
| 2013/0176772 A1 * | 7/2013 | Deng .................... G11C 29/021 365/154 |
| 2013/0276151 A1 * | 10/2013 | Lewis .................... H04L 9/0866 726/34 |
| 2014/0037086 A1 | 2/2014 | Seol |
| 2014/0075051 A1 | 3/2014 | Zadesky |
| 2014/0101063 A1 | 4/2014 | Paul et al. |
| 2014/0143619 A1 | 5/2014 | Gorman |
| 2014/0146607 A1 | 5/2014 | Nagai |
| 2015/0095550 A1 | 4/2015 | Khan |
| 2015/0169247 A1 * | 6/2015 | Wang ..................... G06F 3/0652 711/103 |
| 2015/0193204 A1 | 7/2015 | Lin |
| 2015/0268934 A1 | 9/2015 | Anderson |
| 2016/0034217 A1 | 2/2016 | Kim |
| 2016/0283629 A1 * | 9/2016 | Weckx ................... G06F 30/367 |
| 2017/0032843 A1 | 2/2017 | Ilani |
| 2017/0046129 A1 | 2/2017 | Cambou |
| 2017/0090873 A1 | 3/2017 | Clark |
| 2017/0126229 A1 | 5/2017 | Tan et al. |
| 2017/0269992 A1 | 9/2017 | Bandic |
| 2018/0039484 A1 * | 2/2018 | La Fratta ............ G11C 11/4087 |
| 2018/0158493 A1 | 6/2018 | Ryu |
| 2018/0287793 A1 | 10/2018 | Khativ Zadeh |
| 2019/0096504 A1 * | 3/2019 | Revankar ............... G11C 29/38 |
| 2019/0294500 A1 | 9/2019 | Hara |
| 2020/0081689 A1 | 3/2020 | Huang |
| 2020/0204367 A1 | 6/2020 | Miller |
| 2020/0372967 A1 | 11/2020 | Rahman |
| 2021/0407602 A1 * | 12/2021 | Markov ............ G11C 16/3404 |

OTHER PUBLICATIONS

Wang, et al., "Flash Memory for Ubiquitous Hardware Security Functions: True Random Number Generation and Device Fingerprints," 2012 IEEE Symposium on Security and Privacy, San Francisco, CA, 2012, pp. 33-47.

Poudel, et al., "Microcontroller TRNGs Using Perturbed States of NOR Flash Memory Cells," in IEEE Transactions on Computers, vol. 68, No. 2, pp. 307-313, Feb. 2019.

Ray, et al., "True Random Number Generation Using Read Noise of Flash Memory Cells," in IEEE Transactions on Electron Devices, vol. 65, No. 3, pp. 963-969, Mar. 2018.

Guin, et al., "Counterfeit Integrated Circuits: A Rising Threat in the Global Semiconductor Supply Chain," Proceedings of the IEEE, Aug. 2014, pp. 1207-1228, vol. 102, No. 8.

Guin, et al., "Counterfeit ID Detection and Challenges Ahead," ACM SIGDA Newsletter, Jan. 2013, pp. 1-6.

Guo, et al., "FFD: A Framework for Fake Flash Detection," ACM, Jun. 2017, pp. 1-6.

Kumari, et al., Independent Detection of Recycled Flash Memory: Challenges and Solutions, IEEE, 2018, pp. 89-95.

Irom, et al., "Single Event Effect and Total Ionizeing Dose Results of Highly Scaled Flash Memories," Radiation Effects Data Workshop (REDW), 2013 IEEE, pp. 1-4.

Wikipedia, "Flash Memory," http://en.wikipedia.org/wiki/Flash_memory, Dec. 13, 2017.

Ray, et al., U.S. Appl. No. 16/415,774 entitled, "Random Number Generation Systems and Methods," filed May 17, 2019.

Ray, et al., U.S. Appl. No. 16/219,586 entitled, "Systems and Methods for Detecting Counterfeit Memory," filed Dec. 13, 2018.

Ray, et al., U.S. Appl. No. 16/809,191 entitled, "Systems and Methods for Runtime Analog Sanitation of Memory," filed Mar. 4, 2020.

* cited by examiner

US 11,728,000 B1

SYSTEMS AND METHODS FOR DETECTING COUNTERFEIT OR DEFECTIVE MEMORY

CROSS REFERENCE TO RELATED APPLICATION

This application claims priority to U.S. Provisional Patent Application No.63/024,268, entitled "Methods for Detection of Defects in Flash Memory" and filed on May 13, 2020, which is incorporated herein by reference. This application is a continuation-in-part of U.S. patent application Ser. No. 16/219,586, entitled "Systems and Methods for Detecting Counterfeit Memory" and filed on Dec. 13, 2018, which is incorporated herein by reference. U.S. Patent application Ser. no. 16/219,586 claims priority to U.S. Provisional Application No. 62/598,243, filed on Dec. 13, 2017, which is incorporated herein by reference.

STATEMENT REGARDING FEDERALLY SPONSORED RESEARCH OR DEVELOPMENT

This invention was made with Government support under Contract OIA 1929099 and Contract CBET1935676 awarded by the National Science Foundation. The Government has certain rights in the invention.

RELATED ART

When a consumer purchases a new electronics device, such as a smartphone, the consumer expects that the device, including all of its components, are authentic and adhere to the specifications of the device's manufacture. However, some vendors sell electronics devices having counterfeit components, such as recycled memory, without informing the consumer of the use of the counterfeit components. Counterfeit memory is often less reliable than new memory from the manufacturer or the manufacturer's authorized suppliers, and the use of counterfeit memory can degrade the performance or useful life of the electronics device. In addition, counterfeit memory can sometimes contain malicious code or other code not authorized by the manufacture, and this code can pose a security threat or further affect the reliability of the electronics device.

In addition, some memory chips can contain defects regardless of whether the memory chip is counterfeit. As an example, some chips can contain manufacturing defects or defects that occur over time, such as defects resulting from physical damage, radiation exposure, or other sources of damage.

In an effort to ensure authenticity and integrity of memory for use within electronics devices, techniques have been developed to detect the presence of counterfeit or defective memory. However, such techniques can be expensive, burdensome, and/or invasive. Improved techniques for detecting counterfeit or defective memory are generally desired.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

The present disclosure generally pertains to systems and methods for detecting counterfeit or defective memory. In some embodiments of the present disclosure, various normal memory operations (e.g., erase, read, and write operations) are performed on a memory device, and operational parameters associated with the memory operations are measured or otherwise determined. As an example, the amount of time to perform one or more memory operations may be measured, or a number of errors resulting from the memory operations may be counted or otherwise determined. In other embodiments, other operational parameters indicative of performance of the memory operations may be used. One or more of the operational parameters may be analyzed to determine whether they are in a range expected for counterfeit or defective memory. If not, it is determined that the memory under test is authentic (i.e., not counterfeit) and non-defective and a notification about the determination may be generated.

The techniques described herein for testing memory do not require specialized hardware. Thus, it is possible to download a software application into an electronics device and execute the application using the normal hardware resources of the electronics device in order to test the device's memory. Indeed, the memory in the electronics device can be tested without having to change the hardware resources of the device. In other embodiments, software or hardware for testing memory may reside within a testing unit that can be interfaced with memory devices for testing purposes. Thus, many memory devices can be tested over time with the same testing unit. In other embodiments, other configurations of a system for testing memory are possible.

Figure 1:
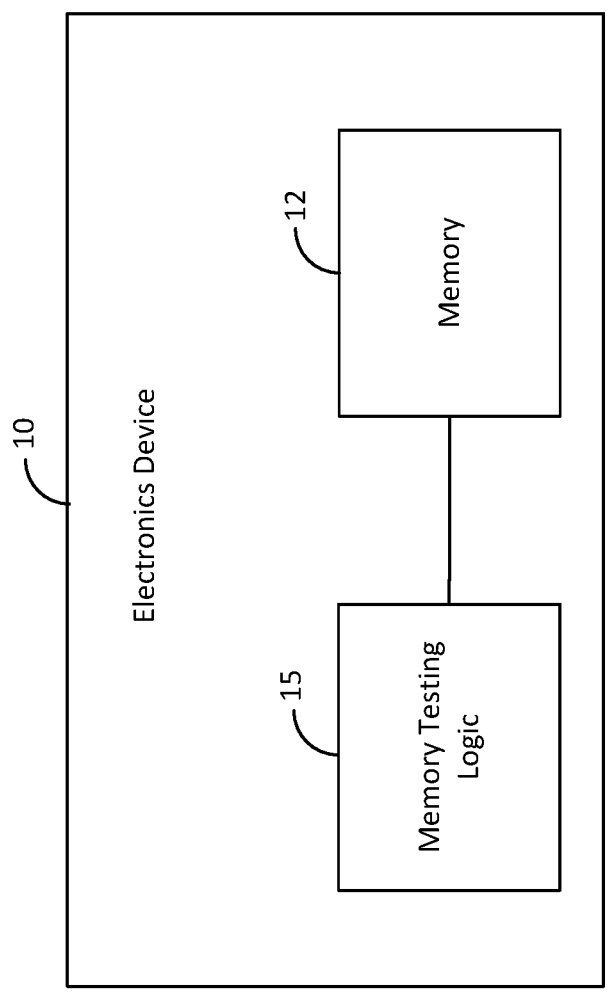
FIG. 1 is a block diagram illustrating an exemplary electronics device configured to detect counterfeit or defective memory in accordance with some embodiments of the present disclosure.

FIG. 1 depicts a block diagram of an electronics device 10 configured to test memory for authenticity or defects in accordance with some embodiments of the present disclosure. In this regard, "authenticity" generally refers to whether memory is counterfeit (e.g., is recycled or from an unauthorized source). That is, memory is not authentic or, in other words, is counterfeit if it has been recycled (previously used by another user) or is from an unauthorized source.

As shown by FIG. 1, the electronics device 10 comprises memory 12 and memory testing logic 15 that is configured to test the memory 12 to determine whether it is counterfeit. In some embodiments, the electronics device 10 may be a smartphone or other mobile device, but in other embodiments, the electronics device 10 may be any device that has or uses memory. As an example, the electronics device 10 may be a desktop or laptop computer or other type of computing device known in the art. In some embodiments, as will be described in more detail below, the electronics device 10 may be a testing unit adapted to receive one or more removable memory units for testing. Yet other types of electronics devices 10 are possible in other embodiments.

Figure 2:
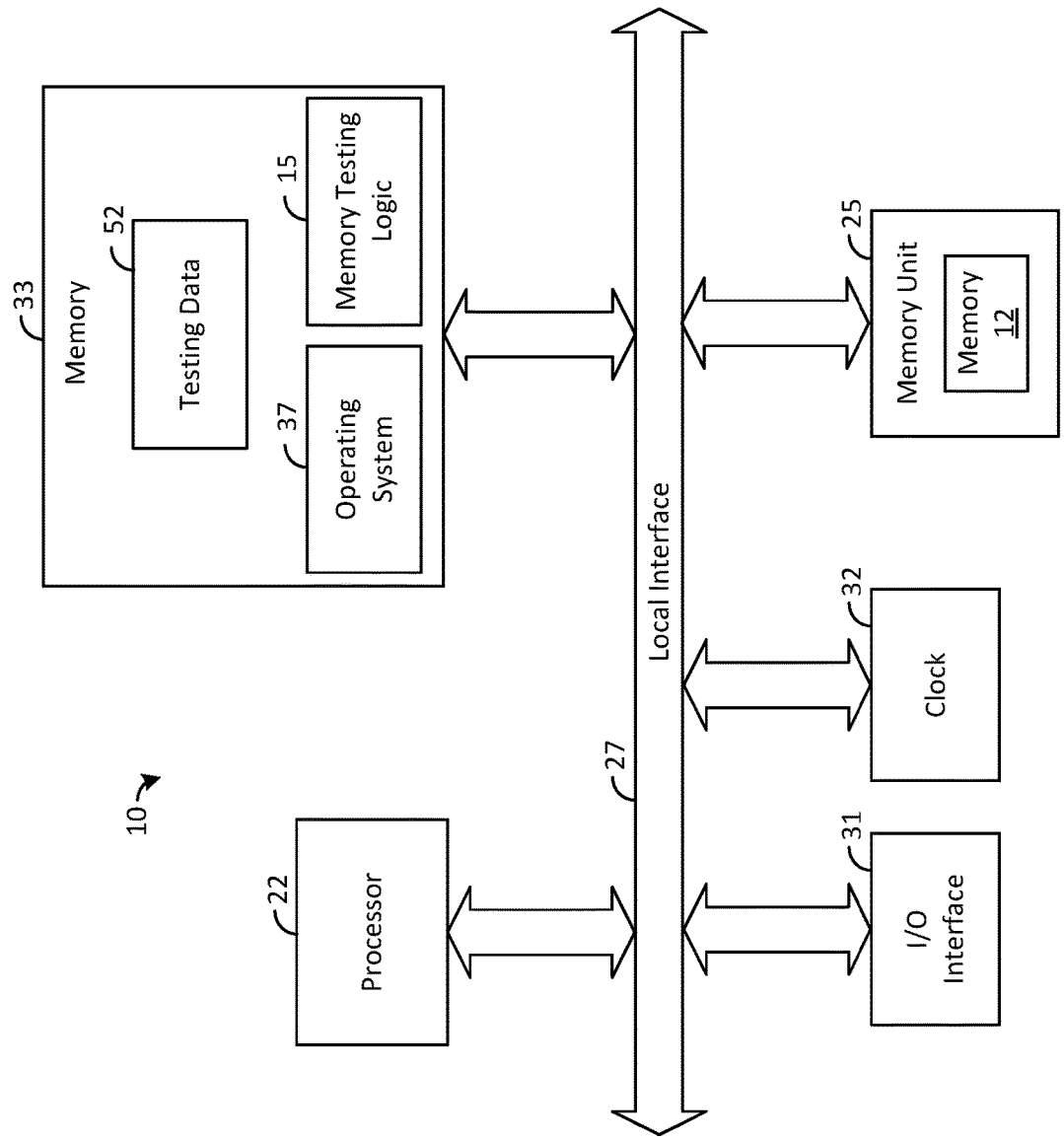
FIG. 2 is a block diagram illustrating an exemplary electronics device, such as is depicted by FIG. 1.

As shown by FIG. 2, the electronics device 10 may include at least one processor 22, a memory unit 25 (e.g., memory chip, disc, or card) having memory 12, a local interface 27, an input/output (I/O) interface 31, and a clock 32. In some embodiments, memory testing logic 15 is implemented in software and stored in memory 33 of the electronics device 10, which may include processing hardware for executing instructions stored in memory 33, such as processor 22. As an example, the processor 22 may comprise a central processor (CPU), a digital signal processor (DSP), or other types of circuitry for executing instructions. The processor 22 communicates to and drives the other elements within the electronics device 10 via a local interface 27, which can include at least one bus. In other embodiments, the memory testing logic 15 may be implemented in hardware, such as a field programmable gate array (FPGA), or a combination of hardware and software.

Memory 33 may be a tangible storage medium. Examples of tangible (or non-transitory) storage medium include disks, thumb drives, hard drives, and other forms of memory. Tangible computer readable storage medium include volatile and non-volatile, removable and non-removable media, such as computer readable instructions, data structures, program modules or other data. Examples of such media include RAM, ROM, EPROM, EEPROM, flash memory, disks or optical storage, magnetic storage, or any other non-transitory medium that stores information.

In some embodiments, input/output interface 31 may comprise various hardware or any combination of hardware and software for receiving inputs from and providing outputs to one or more sources. In some embodiments, input/output interface 31 may comprise a display device for displaying content to a user and an input device for receiving inputs from the user. For example, input/output interface 31 may comprise a touchscreen for displaying a GUI and facilitating communication with a user, such as via capacitive sensing or otherwise. In some embodiments, the input/output interface 31 may be configured for communicating information to a user of the electronics device 10 indicative of testing by the memory testing logic 15, such as an alert or report. In addition, input/output interface 31 may include components (e.g., a cellular or RF radio) to enable the electronics device 10 to communicate with other data sources, such as other electronics devices 10, and may include various components (e.g., hardware) for communication using various protocols and techniques (e.g., Bluetooth, NFC, etc.). Input/output interface 31 may comprise other components in other embodiments.

The memory unit 25 may be a removable unit that is capable of being coupled to and removed from the electronics device 10. The memory 12 within the memory unit 25 may be flash memory, but other types of memory are possible in other embodiments. The memory unit 25 also may include circuitry for performing various functions, such as reading from and writing to the memory 12. In some cases, such circuitry may perform error correction, as will be described in more detail below, in order to correct for errors that occur in the memory 12. Commonly-assigned U.S. Pat. No. 10,509,132, entitled "Flash Memory-Based Radiation Sensing" and filed on Sep. 27, 2017, which is incorporated herein by reference, describes exemplary flash memory cells and techniques for writing to, reading from, and erasing such memory cells.

As shown by FIG. 2, the electronics device 10 may include an operating system 37 that may be implemented in software and may include instructions that, when executed by the processor 22, control execution or operation of various resources of the electronics device 10. The processor 22 may execute operating system 37 to control memory unit 25 and execute instructions of the memory testing logic 15, receive inputs and provide outputs, such as a GUI or other content to a user via input/output interface 31. Operating system 37 may include other functionality ascribed to software operating systems as may be generally known in the art.

Also, stored in the memory 33 is testing data 52 that may be used by the memory testing logic 15 to test the memory 12. As an example, the memory testing logic 15 may determine various parameters associated with the memory 12, and the testing data 52 may indicate expected ranges for such parameters. As an example, the testing data 52 may include predefined thresholds that the logic 15 may compare to the parameters in order to determine whether the parameters indicate that the memory 12 is counterfeit or defective, as will be described in more detail below.

In some embodiments, the testing logic 15 is configured to initiate various normal memory operations that are performed by the memory unit 25 and to then determine operational parameters indicative of the performance of the memory unit 25 in executing the operations. As an example, the operations may include read, write, and erase operations.

In this regard, for a read operation, the memory testing logic 15 may generate a read request that is communicated by the operating system 37 to the memory unit 25. In response to the read request, the memory unit 25 may be configured to read data at a memory address specified by the read request and return the read data to the memory testing logic 15.

For a write operation, the memory testing logic 15 may generate a write request that is communicated by the operating system 37 to the memory unit 25. In response to the write request, the memory unit 25 may be configured to write data from the write request to a memory address specified by the write request. Once the write request is completed, the memory unit 25 returns a notification that is communicated to the memory testing logic 15.

For an erase operation, the memory testing logic 15 may generate an erase request that is communicated by the operating system 37 to the memory unit 25. In response to the erase request, the memory unit 25 may be configured to erase the memory cells at a memory address specified by the erase request. Once the erase request is completed, the memory unit 25 returns a notification that is communicated to the memory testing logic 15.

For a given operation, the memory testing logic 15 is configured to determine one or more operational parameters indicative of the performance of the memory unit 25 in performing the operation. As an example, as will be described in more detail below, the memory testing logic 15 may be configured to determine a duration of the operation or a number of errors generated by the memory unit 25, although other types of operational parameters may be determined in other embodiments. The memory testing logic 15 is configured to compare the one or more operational parameters to the testing data 52 to determine whether the memory 12 is counterfeit or defective. In some cases, the memory testing logic 15 may estimate the age of the memory 12 based on comparisons of the one or more operational parameters to the testing data 52. If desired, a given operational parameter may be averaged over time or otherwise combined with other operational parameters for comparison to the testing data 52. As an example, the durations of a plurality of memory operations of the same type (e.g., write operations) may be averaged or otherwise combined mathematically.

Note that there are various techniques that may be used to determine whether the memory 12 is counterfeit or defective and/or to estimate the age of the memory 12. As an example, the duration of an operation performed by the memory 12 may be used to determine whether the memory 12 is counterfeit or defective. In this regard, a manufacturer of the device 10 or memory 12 may publish an amount of time expected for each operation (e.g., an average amount of time or range required to perform the operation). If the measured duration differs by the expected range by at least a threshold amount, then a determination may be made that the memory 12 is counterfeit or defective (e.g., is recycled or from an unauthorized source).

In this regard, as the memory 12 is used and ages, it may take longer for operations (e.g., read, write, or erase operations) to complete. Also, if the memory 12 is provided from an unauthorized source, then the memory 12 may have different operational characteristics, such as durations of read, write, or erase operations, relative to memory from an authorized source. Thus, if the measured amount of time required to perform an operation exceeds the expected amount of time by at least a threshold amount, then a determination may be made that the memory 12 is counterfeit or defective. In some embodiments, the memory testing logic 15 is configured to determine a difference in the amount of time required to perform an operation and the amount of time expected to perform the operation, as indicated by the testing data 52, and to then compare the difference to a predefined threshold indicated by the testing data 52. If the threshold is exceeded, then the memory testing logic 15 determines that the memory 12 is counterfeit or defective. If desired, the memory testing logic 15 may compare the average amount of time required to perform the operation over time and compare the average time to the testing data 52 in a similar manner. In other embodiments, other techniques for comparing the operational parameters to the testing data 52 are possible.

Note that there are various techniques that may be used to determine the duration of an operation. In some embodiments, the memory testing logic 15 uses the clock 32 (FIG. 2) to determine the time from submission of a request for the operation to the time that the memory testing logic 15 receives notification that the operation is complete. For example, when the memory testing logic 15 submits a read request to the operating system 37, the memory testing logic 12 may receive a timestamp from the clock 32 indicative of the approximate time that the read request is submitted to the operating system 37. Upon receiving the data returned from the memory unit 25 for the read request, the memory testing logic 12 may receive a timestamp from the clock 32 indicated of the approximate time that the data is received. Note that the returned data may serve as notice that the read operation is complete. The difference in the foregoing two timestamps may be calculated to determine the amount of time required to perform the read operation.

The durations of the write and erase operations may be similarly determined. For example, for a write operation, the memory testing logic 15 may use similar techniques to measure or otherwise determine the amount of time between submission of a write request to the operating system 37 and reception by the logic 15 of the notification that the write operation is complete. For an erase operation, the memory testing logic 15 may use similar techniques to measure or otherwise determine the amount of time between submission of an erase request to the operating system 37 and reception by the logic 15 of the notification that the erase operation is complete.

Note that other techniques may be used to determine whether the memory 12 is counterfeit or defective. For example, data errors in the memory 12 may be detected and used to determine whether the memory 12 is counterfeit or defective and/or to estimate the age of the memory 12. In this regard, as memory 12 is used or ages, portions of the individual memory cells, such as oxide layers, may become damaged or worn affecting the memory cell's ability to hold charge. This damage to the memory cell, depending on the extent of such damage, may cause the memory cell to store an incorrect bit value. Generally, a higher number of errors indicates that the memory 12 is older and has been used more.

As indicated above, the memory unit 25 may be configured to perform error correction (e.g., cyclic-redundancy-check (CRC) error correction) in order to correct errors in the data retrieved from memory 12. As known in the art, CRC error correction generally involves appending redundant information to a data value and comparing the data value to the redundant information in order to detect and correct errors in the data value. Thus, by using error correction, the data values returned by the memory unit 25 in response to read requests should have less data errors than the data values actually stored in memory 12.

There are various techniques that may be used by the memory testing logic 15 to detect errors in the memory 12. In one exemplary embodiment, the memory testing logic 15 provides one or more write requests for writing at least one block of data into memory 12. The memory testing logic 15 then submits one or more read requests for reading the block of data from the memory 12. The memory testing logic 15 then compares the block of data written to memory 12 to the same block of data received from the memory 12 in order to determine a number of errors in the returned data. The memory testing logic 15 also compares the number of errors to one or more predefined thresholds. If the number of errors is greater than a certain threshold indicated by the testing data 52 or otherwise, the memory testing logic 15 determines that the memory 12 is counterfeit or defective (e.g., recycled). In such case, the memory testing logic 15 may display via the I/O interface 31 or otherwise a message indicating that the memory 12 is determined to be counterfeit (e.g., recycled).

The memory testing logic 15 may also be configured to estimate an age of the memory 12 based on the number of errors detected or other operational parameters, such as the duration required to perform one or more memory operations. In this regard, a higher number of errors generally indicates greater age. The testing data 52 may define various ages or age ranges and correlate with each age or age range a range of errors expected for memories within the correlated age or age range. In such embodiment, the memory testing logic 15 may consult the testing data 52 to determine one or more values indicative of the memory's estimated age or age range correlated with the number of errors detected from the memory 12, and the memory testing logic 15 may display via the I/O interface 31 or otherwise a message including such value or values to indicate the memory's estimated age. In other embodiments, messages indicating whether the memory is counterfeit and/or the memory's estimated age may be transmitted to another device (e.g., a remote server) for display.

In another embodiment, the age estimate may be based on the duration required to complete one or more memory operations. As an example, the durations required to perform memory operations may be determined according to the techniques described above. If desired, the average duration of a particular type or types of memory operations may be determined, as described above for determining authenticity of defects. A longer duration may generally indicate that the memory 12 is older, and the memory testing logic 15 may be configured to estimate age, wherein a longer duration corresponds to a greater age estimate. Other techniques for estimating age are possible in other embodiments.

Note that if the memory unit 25 uses error correction, the memory testing logic 15 may be configured to disable such error correction before writing and reading data for testing the memory 12. In this regard, the protocol used by the operating system 37 may define a function call for disabling error correction in the memory unit 25. In such embodiment, the memory testing logic 15, before initiating a test of the memory 12, may submit such function call to the operating system 37, which then instructs the memory unit 25 to disable error correction. Thus, during the testing, the data values returned to the memory testing logic 15 are not corrected for errors by the memory unit 25 allowing the memory testing logic 15 to determine the total number of errors in memory 12 for the data written to and read from memory 12.

In addition, it has been observed that a more accurate determination about the state of the memory 12 can be made, using the error detection techniques described above, if an operation, referred to herein as "stressing," is performed on the memory 12 prior to testing. Stressing the memory 12 involves repetitively performing one or more memory operations, such as writing, reading, and erasing, on cells of the memory 12 to be tested. Repetitively changing the values in the memory cells causes the charge levels in the memory cells to fluctuate so that, if a memory cell is damaged, it is more likely that a data error will be exhibited by the cell during testing. Thus, by stressing the memory 12 just prior to testing, the error count determined in testing is more likely to better reflect the actual number of memory cells that are damaged. That is, the number of bit errors determined in testing is likely closer to the actual number of memory cells that are damaged.

Erase and read operations generally wear on the memory cells more than writing operations. That is, erase and read operations have a greater effect on memory degradation relative to writing operations. Thus, in an effort to reduce memory degradation resulting from the testing, the stressing initiated by the memory testing logic 15 only includes writing of data values to memory 12 in a preferred embodiment and, in particular, does not include erase or read operations. As an example, prior to testing, the memory testing logic 15 may write random or predefined values to all of the memory cells to be tested a certain number of times (e.g., about ten or more) so that damaged memory cells are more likely to exhibit bit errors during testing. However, in other embodiments, the stressing may involve other types of memory operations.

Operations that can be performed without causing damage to the memory cells of the memory 12 under test can be referred to as "non-invasive." The stressing described above with the use of write operations is generally non-invasive since write operations do not significantly degrade memory. Further, measuring durations of memory operations in non-invasive and counting errors in values returned from memory are both non-invasive. Indeed, it is possible for durations or errors associated with memory operations performed in normal operation of the electronics device 10 to be used for determining authenticity or defects or for estimating age. That is, the memory operations do not have to be specifically performed for testing purposes, but rather operational parameters associated with memory operations performed as part of the normal operation of the electronics device 12 may be used for testing. Moreover, the techniques described herein may be non-invasive to the memory 12 being tested.

Figure 3:
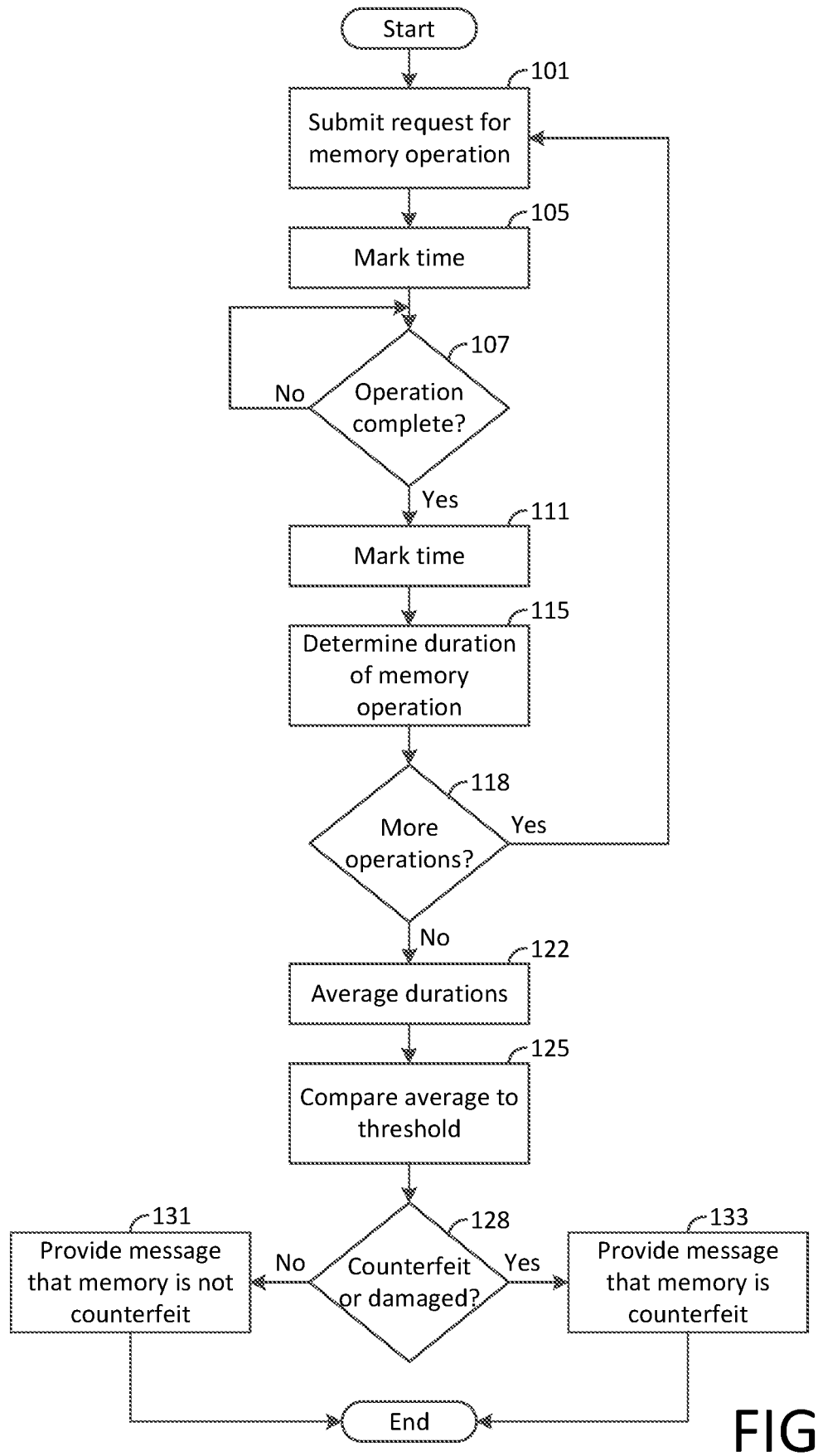
FIG. 3 is a flow chart illustrating an exemplary method for testing an electronics device, such as is depicted by FIG. 2.

An exemplary testing operation will now be described in more detail below with reference to FIG. 3.

In this regard, for illustrative purposes, assume that the memory testing logic 15 is configured to perform testing based on the durations of write operations, though it is possible for other memory operations and testing techniques to be used, as described above. As shown by blocks 101 and 105 of FIG. 3, the memory testing logic 15 submits to the operating system 37 a write request for writing to the memory 12, and the logic 15 also marks the time that the write request is submitted to the operating system 37. In response, the operating system 37 causes the memory unit 25 to perform the requested write operation. Once the write operation is completed, the operating system 37 is notified by the memory unit 25 and provides a notification of the completed write operation to the memory testing logic 15.

As shown by blocks 107 and 111, the memory testing logic 15 may wait on the notification and mark the time that the logic 15 receives the notification from the operating system 37. Based on the times marked in blocks 105 and 111, the memory testing logic 15 determines the duration of the write operation, as shown by block 115. The memory testing logic 15 then determines if more write operations are to be performed for the testing, as shown by block 118. If so, the memory testing logic 15 repeats the steps described above.

Once all of the write operations for the test have been performed, the memory testing logic 15 averages the durations determined in block 115 for all of such write operations to provide a value indicative of the average time required for the write operations to be completed, as shown by block 122. As shown by block 125, the memory testing logic 15 compares the averaged value to a predefined threshold. If the threshold is exceeded, the memory testing logic 15 determines that memory 12 is counterfeit or damaged in block 128 and provides a message indicating such determination, as shown by block 133. Otherwise, the memory testing logic 15 determines that memory 12 is not counterfeit or damaged in block 128 and provides a message indicating such determination, as shown by block 131.

Figure 4:
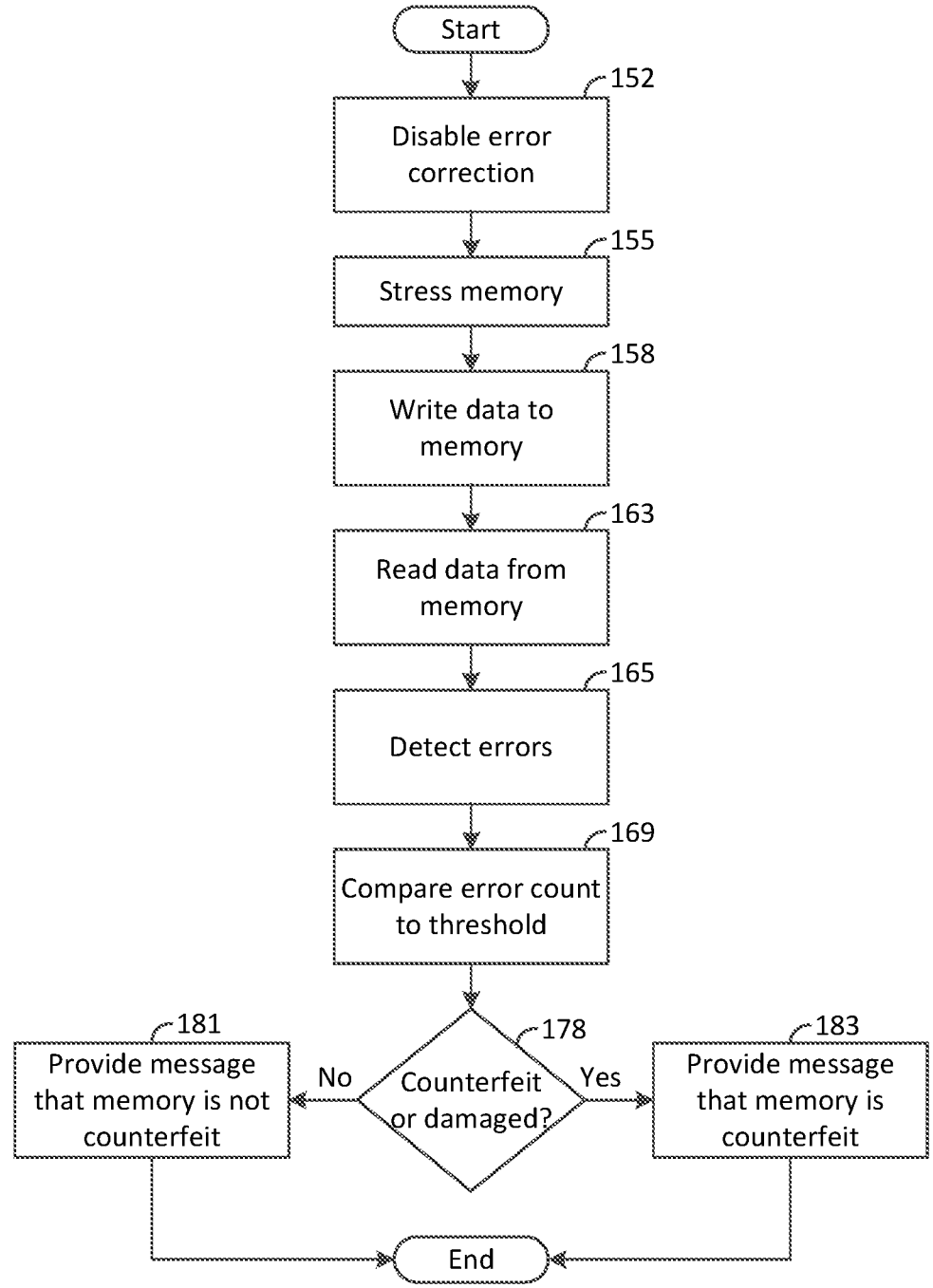
FIG. 4 is a flow chart illustrating an exemplary method for testing an electronics device, such as is depicted by FIG. 2.

An exemplary testing operation will now be described in more detail below with reference to FIG. 4.

In this regard, for illustrative purposes, assume that the memory testing logic 15 is configured to perform testing based on data errors detected in the memory 12, though it is possible for other memory operations and testing techniques to be used, as described above. As shown by block 152 of FIG. 4, the memory testing logic 15 disables error correction in the memory unit 25, assuming that error correction is in fact used by the memory unit 25. As shown by block 155, the memory testing logic 15 then stresses the memory 12 by performing a plurality of data writes to the memory 12. In this regard, the memory testing logic 15 may submit write requests to the operating system 37, which controls the memory unit 25 to perform the requested write operations, as described above.

As shown by blocks 158 and 163, the memory testing logic 15 writes a block of data to the memory 12 and then reads this block of data from the memory 12. In this regard, the memory testing logic 15 may submit one or more write requests and read requests to the operating system 37, which then controls the memory unit 25 to perform the requested write operations and read operations, as described above. The memory testing logic 15 compares the data block written to the memory 12 in block 158 and the data block read from the memory 12 in block 163 in order to determine a number of data errors in the returned data block, as shown by block 165. The memory testing logic 15 also compares the number of errors to a predefined threshold, as shown by block 169. If the threshold is exceeded, the memory testing logic 15 determines that memory 12 is counterfeit in block 178 and provides a message indicating such determination, as shown by block 183. Otherwise, the memory testing logic 15 determines that memory 12 is not counterfeit in block 178 and provides a message indicating such determination, as shown by block 181. Note that the number of data errors may also be used to estimate the age of the memory 12, as described above, and the estimated age of the memory 12 may be included in the message provided by the memory testing logic 15.

In various embodiments described herein, it is possible for instructions of the memory testing logic 15 to be downloaded into conventional electronics devices 10, such as smartphones, and executed to perform the testing operations described above without requiring specialized hardware to be added to the conventional electronics devices 10. That is, conventional electronics devices can be retrofitted to perform the memory testing described herein by simply downloading instructions of the memory testing logic 15 into the electronics device 10 or otherwise providing the electronics device 10 with access to the memory testing logic 15. However, it is also possible to design new electronics devices 10 or redesign the hardware of existing electronics devices 10 to implement the memory testing techniques described herein.

Figures 5, 6:
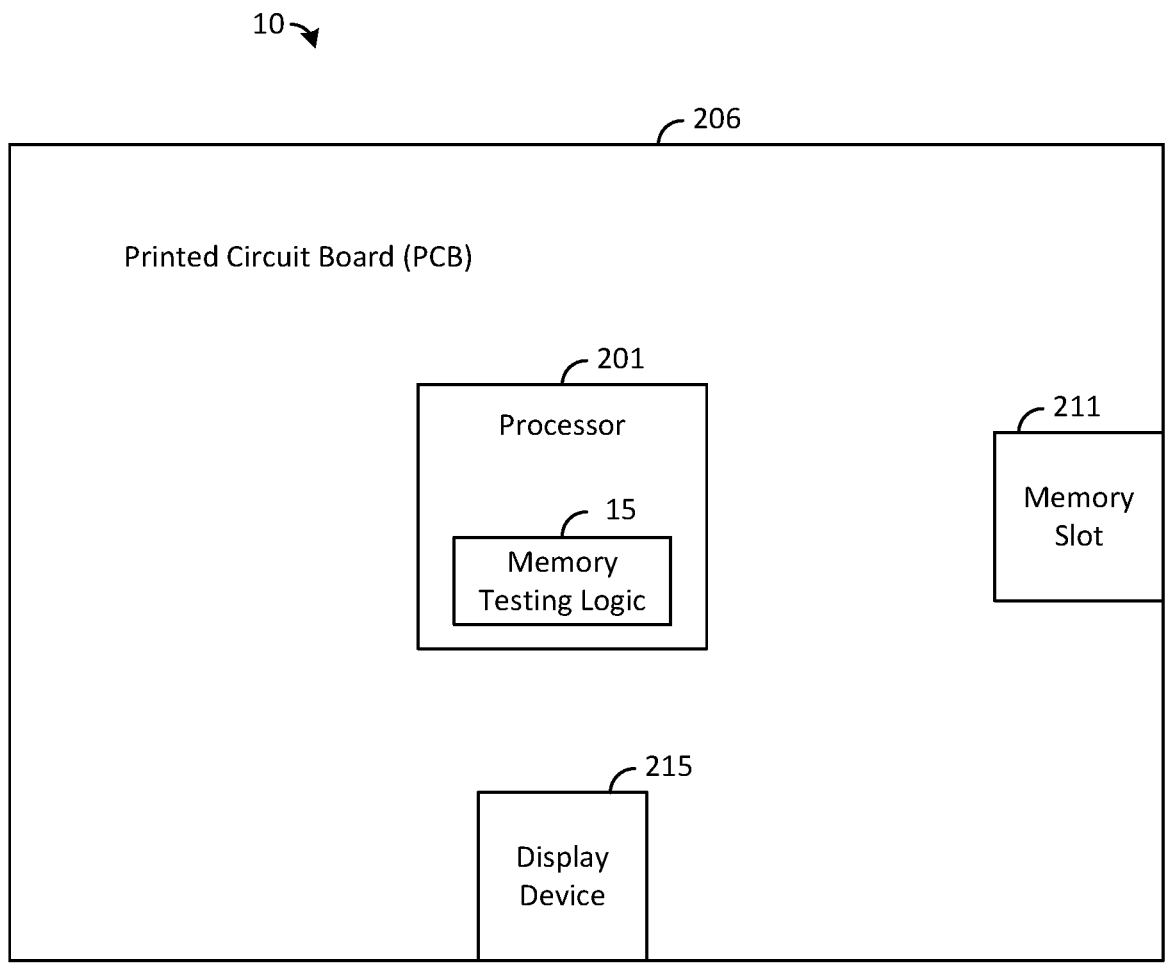
FIG. 5 is a block diagram illustrating an exemplary testing unit in accordance with some embodiments of the present disclosure.
FIG. 6 is a schematic illustrating an exemplary memory cell.

FIG. 5 depicts an exemplary embodiment of an electronics device 10 that may be used to test the memory 12 of a large number of memory units 25. Specifically, the electronics device 10 defines a testing unit that may be used to test memory 12 to be inserted into and used by other electronics devices. In this regard, the memory testing logic 15 is implemented in software in the embodiment depicted by FIG. 5, though it is possible for the memory testing logic 15 to be implemented in hardware or a combination of hardware and software. In the embodiment shown by FIG. 5, the memory testing logic 15 is stored in and executed by at least one processor 201. As shown by FIG. 5, the processor 201 and other components of the electronics device 10 reside on a printed circuit board (PCB) 206, though other configurations of the electronics device 10 are possible in other embodiments.

The electronics device 10 of FIG. 5 includes a memory slot 211 into which a memory unit 25, such as a memory chip, disc, or card, may be inserted and removed. When a memory unit 25 is inserted into the slot 211, the memory testing logic 15 may perform a test on the memory 12 of the memory unit 25 using techniques similar to those described above in order to determine whether the memory 12 is counterfeit and/or to estimate the age of the memory 12. The result of the test may be displayed by a display device 215, such as a liquid crystal display (LCD) or other type of display device. Yet other configurations of an electronics device 10 for testing the authenticity of memory are possible in other embodiments.

It should be noted that various other testing techniques may be used in addition to or in lieu of the techniques described above. As an example, the testing logic 15 may be configured to analyze a block or other set of memory 12 over time to identify cells having abnormal voltage fluctuations. The value stored in such a cell may be characterized as "noisy" since cell's voltage fluctuates in an abnormal and possibly random manner over time. Further, a "noisy bit" refers to a data value in a memory cell that changes state multiple times for multiple read operations as a result of abnormal voltage fluctuations in the memory cell. Such a noisy bit may be distinguished from other types of bits that change state for other reasons, such as voltage leakage, in that a noisy bit may change many times from a first state (e.g., a "0" or a logical low value) to a second state (e.g., a "1" or a logical high value) and then back to the first state (without the cell being overwritten or erased). Indeed, a bit is considered to be more "noisy" the more times that it changes state during a given number of consecutive read operations. In some embodiments, a cell may be identified as storing a noisy bit when the value read from the cell changes state at least a certain number of times in the performance of consecutive read operations (without any intervening write or erase operations that would otherwise change the value stored to the cell), thereby indicating that there is significant voltage fluctuation occurring in the cell.

As an example, to determine whether a cell is storing a noisy bit, the testing logic 15 may be configured to write a particular value to the cell, such as a "0" or logical low value. Such an operation may cause a sufficient amount of charge to be stored into the cell such that the voltage in the cell exceeds a predefined threshold, referred to as the "read threshold," that is used to read the cell. That is, if the voltage in the cell exceeds the read threshold, then a read operation returns one value (e.g., "0"), but if the voltage in the cell is below the read threshold, then a read operation returns another value (e.g., a "1"). Normally, when a value is written to a cell, it is expected that the same value will be read from the cell assuming that the value in the cell is not changed by an intervening write or erase operation. However, if there is significant abnormal voltage fluctuation in the cell (e.g., from a defect), it is possible that a different value may be read. As an example, due to abnormal voltage fluctuations, it is possible for the voltage in the cell to fall below the read threshold such that the value read from the cell is a "1" when in fact the last write operation stored a "0" to the cell. However, those same voltage fluctuations may cause the voltage in the cell to again exceed the read threshold such that a "0" is later read from the cell. Also, over time, the voltage fluctuations may cause the value in the cell to continuously transition above and below the read threshold in essentially a random manner.

In some embodiments, after storing a particular value (e.g., a "0") to a cell, the testing logic 15 is configured to read the cell multiple times by submitting multiple consecutive read requests to the memory unit 25. The testing logic 15 then compares the bit values read from the cell over numerous read operations to determine the number of times that the cell changed states (e.g., changed from a "0" to a "1" or from a "1" to a "0"), noting that a normal cell is expected to return the same value (i.e., the value previously written to the cell at the start of testing) for all of the read operations. If the number of state transitions exceeds a predefined threshold, then the testing logic 15 may identify the cell as storing a noisy bit or, in other words, the cell is experiencing abnormal voltage fluctuations that cause the value stored in the cell to change excessively over time.

In some embodiments, the testing logic 15 is configured to analyze a plurality of cells according to the techniques described above, such as each cell in a given block of memory, and to count the number of cells identified as storing a noisy bit. The testing logic 15 then compares this number to a predefined threshold and identifies the memory 12 as counterfeit or defective if the count exceeds the predefined threshold. In such case, the testing logic 15 may output a warning or other message indicating that the memory 12 has been determined to be counterfeit or defective.

To better illustrate the foregoing, assume that the testing logic 15 is configured to perform a test of the memory 12 by writing a four bit value, 0000, to four cells of the memory 12, as shown by FIG. 6, where each bit is stored in a respective memory cell. This example uses four bits for illustrative purposes, but in practice, the testing logic 15 can test any number of bits at the same time, or the testing logic 15 can test different cells at different times.

After writing a predefined bit value to each cell, the testing logic 15 then performs eight consecutive read operations to read the four cells. In this regard, the testing logic 15 submits a read request to the memory unit 25, which then interacts with the memory 12 to read the cells storing the four bit value previously written by the write operation. As shown by FIG. 6, for three of the cells (i.e., cells "1," "3," and "4"), a 0 is returned for each read operation. Since there are no transitions of the bit values in these cells, the testing logic 15 may determine that each of these three cells is not storing a noisy bit. However, as shown by FIG. 6, the bit values read for the other cell (i.e., cell "2") transition states five times. Specifically, there are five read operations (i.e., read operations "2," "3," "5," "7", and "8") for which the bit value read from the cell is different than the bit value respectively read from the cell for the previous read operation. In such example, the testing logic 15 may compare this number (i.e., 5) to a predefined threshold (e.g., 3) and identify the cell as storing a noisy bit if such number is greater than the threshold. The testing logic 15 may perform this test for any number of memory cells and determine that the memory 12 is counterfeit or defective if the total number of cells identified as storing noisy bits is greater than a predetermined threshold. In such case, the testing logic 15 may display a warning that the memory 12 is counterfeit or defective or take some other action as may be desired.

In some embodiments, the memory unit 25 may be configured to change the threshold, referred to hereafter as the "read threshold," used for reading cells when a test is being performed as compared to when normal read operations are performed. Changing (e.g., increasing) the read threshold may help to identify more cells that are exhibiting abnormal voltage fluctuations and thus storing noisy bits. As an example, moving the read threshold closer to the expected voltage level for a cell while it is storing a particular value (e.g., a "0" or logical low value) can cause the cell to transition to a different value in response to a smaller voltage change. As an example, increasing the read threshold for a cell storing a "0" should cause the stored value to transition to a "1" in response to a smaller voltage change relative to an embodiment in which a lower read threshold is used. That is, the cell should transition to a "1" in response to a smaller decrease in the cell's voltage level. Thus, over time, the cell is likely to experience more transitions of the stored value thereby facilitating identification of a noisy bit within the cell. Moreover, by increasing the read threshold during testing for all of the cells under test, it is likely that more noisy bits will be identified, thereby resulting in more accurate assessments about whether the memory 12 is counterfeit or defective. However, it should be noted that adjusting the read threshold for the read operations during testing is unnecessary as there may be sufficient transitioning of data values in the memory to identify noisy bits without adjusting the read threshold.

Figure 7:
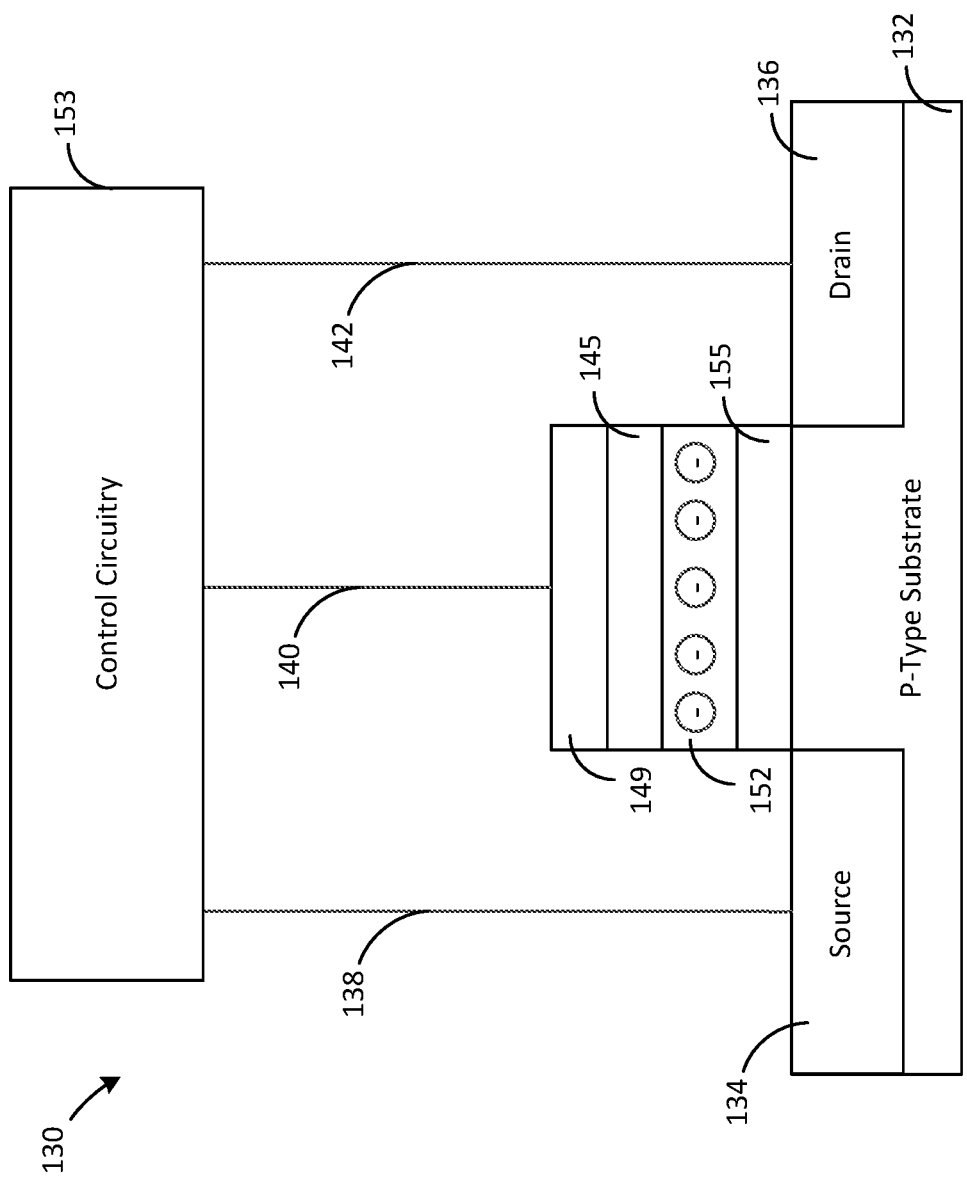
FIG. 7 depicts an exemplary set of write and read operations for testing four memory cells where one of the memory cells is storing a noisy bit.

FIG. 7 depicts a memory cell 130 of flash memory. The memory cell 130 of FIG. 7 has a substrate 132, source 134, drain 136, ground line 138, word line 140, and bit line 142. The memory cell 130 has a blocking oxide 145 below the control gate 149 and tunnel oxide 155 below the floating gate 152. Voltage may be applied to the cell 130 via the lines 138, 140, 142 to perform read/erase/program operations. Structurally, a flash memory cell 130 comprises a floating gate metal-oxide-semiconductor field effect transistor (FG-MOSFET) 152, which allows electrons from the silicon substrate 132 to be tunneled into the floating gate 152 during the program operation (e.g., by applying a large positive charge differential across the control gate 149 and the substrate 132). The erasure operation uses tunneling to remove electrons from the floating gate 152 to the substrate 132 (e.g., by applying a large negative charge differential across the control gate 149 and the substrate 132).

The value stored in the memory cell 130 can be changed through an erase operation or a write operation, also sometimes referred to as a program operation, performed by control circuitry 153. Note that the control circuitry 153 may be implemented in hardware or any combination of hardware and software. The erase operation in a cell 130 of flash memory typically involves setting a high voltage on the substrate 132 and a low voltage on the control gate 149 causing electron tunneling from the floating gate 152. An erase operation often forces the bit value in a memory cell 130 to a logical high value (e.g., a "1").

The program operation involves setting a high voltage on the control gate 149 and a low voltage on the substrate 132. This voltage differential causes electron tunneling to the floating gate 152. Controlling the voltage on selected bit lines 142 and word lines 140 of a plurality of cells 130 affects which page and memory cells 130 of a memory page are programed. A program operation often forces the bit value in a memory cell 130 being programmed to a logical low value (e.g., a "0"). During the programing operation, only the set of memory cells 130 to which a high gate voltage is applied are forced to the logical low bit value (e.g., from one "1" to zero "0"), and the values in the remaining memory cells 130 remain unchanged.

The read operation involves setting the control gate 149 to a reference voltage, $V_{ref}$, and then determining whether the cell 130 is conductive or, in other words, whether current flows between the source 134 and drain 136. In this regard, current will flow depending on whether the charge stored in the cell 130 exceeds the threshold voltage applied to the control gate 149. Thus, the reference voltage applied to the control gate 149 during a read operation defines the read threshold described above, and changing this reference voltage has the effect of changing the read threshold. As described above, during testing of the cell 130, the testing logic 15 may instruct the control circuitry 153 of the memory unit 25 to apply a higher reference voltage for read operations relative to the reference voltage applied for normal read operations. This higher reference voltage has the effect of increasing the read threshold and, thus, likely increasing the number of transitions in the value read from the cell 130 in the event that the cell 130 is having abnormal voltage fluctuations due to a defect (e.g., damage).

In some embodiments, the amount of power consumed to perform one or more memory operations may be used to determine whether the memory 12 is counterfeit or defective. In this regard, the design of counterfeit memory may be different such that it consumes a different amount of power relative to that consumed by authentic memory. In addition, over time, due to damage or wear, authentic memory may begin to consume more power. The testing logic 15 may be configured to determine a value indicative of an amount of power consumed for performing one or more memory operations and to compare this value to a predefined threshold. If the threshold is exceeded, the testing logic 15 may be configured to determine that the memory 12 is counterfeit or defective.

Figure 8:
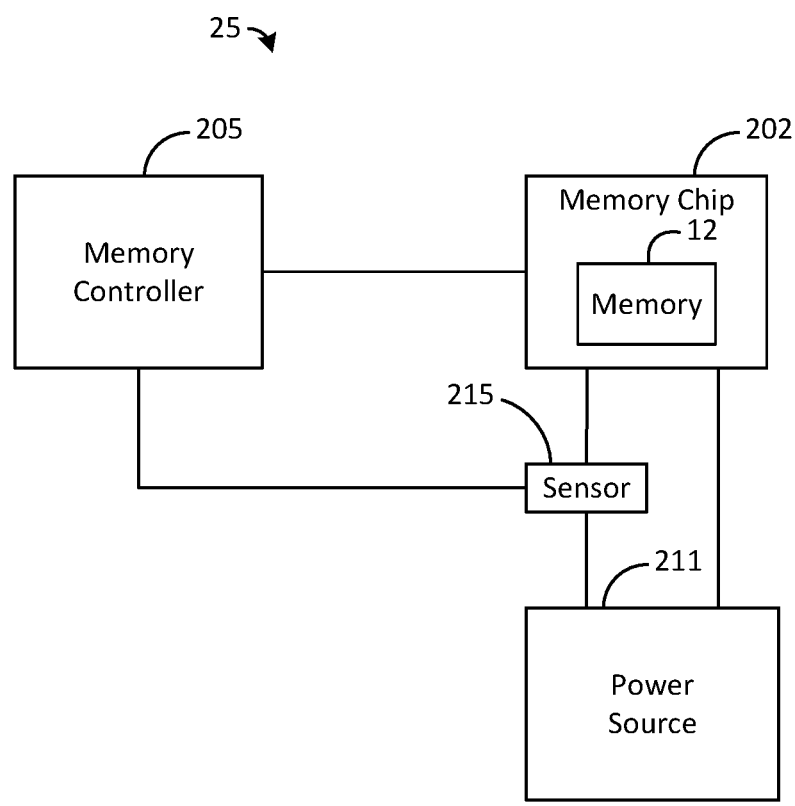
FIG. 8 depicts an exemplary embodiment of a memory unit, such as is depicted by FIG. 2.

FIG. 8 depicts an exemplary embodiment of a memory unit 25. The memory unit may have one or more memory chips 202 comprising memory 12, and each memory chip 202 may be electrically coupled to a memory controller 205 that interfaces with the memory chip 202 to perform memory operations, such as read, write, and erase operations. As an example, in response to a request from the testing logic 15, the memory controller 205 may be configured to communicate with the memory chip 202 to perform a memory operation requested by the testing logic 15. If the memory operation is a read, the memory controller 205 may return the read data to the testing logic 15, which may then analyze the read data to determine whether the memory 12 is counterfeit or defective using the techniques described herein.

As shown by FIG. 8, the memory chip 202 may be electrically connected to a power source 211, such as battery, for receiving a power signal that drives the electronics within the memory chip 202. In the embodiment shown by FIG. 8, the memory unit 25 includes a sensor 215 that is configured to measure a value indicative of the power consumed by the memory chip 202 from the power source 211. As an example, the sensor 215 may be configured measure the amount of current passing from the power source 211 to the memory chip 25 and/or the voltage of the power signal. The memory controller 205 may be configured to receive the sensor data from the sensor 215 to calculate or otherwise determine a value indicative of the power consumed by the memory chip 202. As an example, the memory controller 25 may calculate the amount of power consumed by the memory chip 202 by multiplying the measured current by the measured voltage of the power signal from the power source 211. In other embodiments, the value determined by the memory controller 205 may simply be the measurement of current consumed by the memory chip 202. Yet other types of values may be indicative of the power consumed by the memory chip 202 in other examples.

After determining the value indicative of consumed power, the memory controller 205 may report such value to the testing logic 15, which then analyzes the value to determine whether the memory 12 is counterfeit or defective. In some cases, the testing logic 15 may average the consumed power over time or otherwise calculate the amount of power consumed by the memory chip 202 based on many measurements by the sensor 215 to help smooth the effects of normal power variations. In any event, the testing logic 15 may compare a value indicative of the consumed power to a predefined threshold and determines that the memory 12 is counterfeit or defective if the threshold is exceeded. In other embodiments, the testing logic 15 may use the value indicative of consumed power in other ways to make such a determination.

Note that similar techniques may be used to determine whether other groups of memory are counterfeit or defective. For example, rather than analyzing the power consumed chip-by-chip, the power consumed by multiple chips (or other units of memory) may be determined and then compared to a threshold, as described above.

It should also be noted that the determination regarding whether memory 12 is counterfeit or defective may be based on any number of factors. As an example, a combination of the techniques described above may be used to assess whether memory 12 is counterfeit or defective where each described technique is a factor in the overall determination. As an example, memory 12 may be determined to be counterfeit only if both (1) the number of noisy bits exceeds a first threshold and (2) the average power consumed for memory operations on the memory 12 exceeds a second threshold. In some embodiments, the testing logic 15 may determine an overall score where each factor contributes to the value of the overall score, and this score may be compared to a predefined threshold in order to determine whether the memory 12 is counterfeit or defective. As an example, the score may be increased when (1) the number of noisy bits are higher, (2) a higher amount of power is consumed, (3) the number of memory errors is higher, and/or (4) the amount of time for performing memory operations is greater. In other embodiments, yet other techniques for assessing the memory 12 are possible based on any number of the factors described herein.

The foregoing is merely illustrative of the principles of this disclosure and various modifications may be made by those skilled in the art without departing from the scope of this disclosure. The above described embodiments are presented for purposes of illustration and not of limitation. The present disclosure also can take many forms other than those explicitly described herein. Accordingly, it is emphasized that this disclosure is not limited to the explicitly disclosed methods, systems, and apparatuses, but is intended to include variations to and modifications thereof, which are within the spirit of the following claims.

As a further example, variations of apparatus or process parameters (e.g., dimensions, configurations, components, process step order, etc.) may be made to further optimize the provided structures, devices and methods, as shown and described herein. In any event, the structures and devices, as well as the associated methods, described herein have many applications. Therefore, the disclosed subject matter should not be limited to any single embodiment described herein, but rather should be construed in breadth and scope in accordance with the appended claims.

Now, therefore, the following is claimed:

1. An electronics device, comprising:
    memory having at least one memory cell; and
    circuitry configured to write a value into the memory cell and to perform a plurality of consecutive read operations for reading the value written into the memory cell, thereby providing a plurality of read values, the circuitry further configured to compare the read values and to determine a value indicative of a number of transitions in the read values based on comparisons of the read values, wherein the circuitry is configured to determine whether the memory cell is storing a noisy bit associated with abnormal voltage fluctuations in the memory cell based on the determined value, and wherein the circuitry is configured to determine whether the memory is counterfeit or defective based on whether the memory cell is determined to be storing the noisy bit.

2. The electronics device of claim 1, wherein the circuitry is configured to provide an output indicative of whether the memory is determined to be counterfeit or defective.

3. The electronics device of claim 1, wherein the circuitry is configured to compare the determined value to a threshold.

4. The electronics device of claim 1, wherein the circuitry is configured to adjust, for the plurality of consecutive read operations, a read threshold for reading the memory cell.

5. The electronics device of claim 4, wherein the circuitry is configured to increase the read threshold for the plurality of read operations.

6. An electronics device, comprising:
memory having a plurality of memory cells; and
circuitry configured to determine which of the plurality of memory cells are storing noisy bits associated with abnormal voltage fluctuations in the plurality of memory cells, the circuitry further configured to determine a first value indicting a number of the plurality of memory cells determined to be storing noisy bits and to determine whether the memory is counterfeit or defective based on the first value, wherein the circuitry is configured to write a bit value to one of the plurality of memory cells and to perform a plurality of consecutive read operations for reading the one of the plurality of memory cells, wherein the circuitry is further configured to compare read bit values from each of the plurality of read operations and to determine a second value indicative of a number of transitions in the read values based on comparisons of the read bit value, and wherein the circuitry is configured to determine whether the one of the plurality of memory cells is storing a noisy bit based on the second value.

7. The electronics device of claim 6, wherein the circuitry comprises at least one processor programmed with instructions that are stored on a non-transitory computer readable medium and, when executed by the at least one processor, cause the at least one processor to determine the first value and whether the memory is counterfeit or defective based on the first value.

8. The electronics device of claim 6, wherein the circuitry is configured to compare the first value to a predefined threshold.

9. The electronics device of claim 6, wherein the circuitry is configured to provide an output indicative of whether the memory is determined to be counterfeit or defective.

10. The electronics device of claim 6, wherein the circuitry is configured to compare the second value to a threshold.

11. The electronics device of claim 6, wherein the circuitry is configured to adjust, for the plurality of consecutive read operations, a read threshold for reading the one of the plurality of memory cells.

12. The electronics device of claim 11, wherein the circuitry is configured to increase the read threshold for the plurality of read operations.

13. A method for use in an electronics device, comprising:
storing bit values in memory cells of memory;
reading the bit values from the memory cells;
analyzing the read bit values;
determining, based on the analyzing, which of the memory cells are storing noisy bits associated with abnormal voltage fluctuations in the memory cells;
determining a first value indicting a number of the memory cells determined to be storing the noisy bits;
performing a plurality of consecutive read operations for reading one of the plurality of memory cells;
comparing read bit values from each of the plurality of read operations;
determining a second value indicative of a number of transitions in the compared bit values;
determining whether the one of the plurality of memory cells is storing a noisy bit based on the second value;
determining whether the memory is counterfeit or defective based on the first value; and
providing an output indicative of whether the memory is determined to be counterfeit or defective.

14. The method of claim 13, further comprising comparing the first value to a predefined threshold.

15. The method of claim 13, further comprising comparing the second value to a threshold.

16. The method of claim 13, further comprising adjusting, for the plurality of consecutive read operations, a read threshold for reading the one of the plurality of memory cells.

17. The method of claim 16, wherein the adjusting comprises increasing the read threshold for the plurality of read operations.

18. A method for testing memory, comprising:
writing a value into a memory cell of the memory;
performing a plurality of consecutive read operations for reading the value written into the memory cell, thereby providing a plurality of read values;
comparing the read values;
determining a value indicative of a number of transitions in the compared values based on the comparing;
determining whether the memory cell is storing a noisy bit associated with abnormal voltage fluctuations in the memory cell based on the determined value;
determining whether the memory is counterfeit or defective based on whether the memory cell is determined to be storing the noisy bit; and
providing an output indicative of whether the memory is determined to be counterfeit or defective.

* * * * *